United States Patent
Pfützner et al.

(10) Patent No.: US 8,772,154 B2
(45) Date of Patent: Jul. 8, 2014

(54) INTEGRATED CIRCUITS INCLUDING BARRIER POLISH STOP LAYERS AND METHODS FOR THE MANUFACTURE THEREOF

(75) Inventors: Egon Ronny Pfützner, Dresden (DE); Carsten Peters, Dresden (DE); Jens Heinrich, Wachau (DE)

(73) Assignee: GlobalFoundries, Inc., Grand Cayman (KY)

( * ) Notice: Subject to any disclaimer, the term of this patent is extended or adjusted under 35 U.S.C. 154(b) by 129 days.

(21) Appl. No.: 13/163,495

(22) Filed: Jun. 17, 2011

(65) Prior Publication Data

US 2012/0319285 A1    Dec. 20, 2012

(51) Int. Cl.
*H01L 21/768* (2006.01)
*H01L 23/535* (2006.01)

(52) U.S. Cl.
USPC ........... 438/631; 438/633; 438/634; 438/638; 438/645

(58) Field of Classification Search
USPC ............... 438/618–681, E23.141, E21.495
See application file for complete search history.

(56) References Cited

U.S. PATENT DOCUMENTS

| | | | |
|---|---|---|---|
| 7,384,471 B2* | 6/2008 | Vrtis et al. | 106/287.14 |
| 2005/0151224 A1* | 7/2005 | Abe | 438/221 |
| 2006/0043590 A1* | 3/2006 | Chen et al. | 438/629 |
| 2007/0249179 A1* | 10/2007 | Lin et al. | 438/758 |
| 2008/0171434 A1* | 7/2008 | Chang et al. | 438/666 |

* cited by examiner

*Primary Examiner* — Cuong Q Nguyen
(74) *Attorney, Agent, or Firm* — Ingrassia Fisher & Lorenz, P.C.

(57) ABSTRACT

Embodiments of a method for fabricating integrated circuits are provided, as are embodiments of an integrated circuit. In one embodiment, the method includes the steps of depositing an interlayer dielectric ("ILD") layer over a semiconductor device, depositing a barrier polish stop layer over the ILD layer, and patterning at least the barrier polish stop layer and the ILD layer to create a plurality of etch features therein. Copper is plated over the barrier polish stop layer and into the plurality of etch features to produce a copper overburden overlying the barrier polish stop layer and a plurality of conductive interconnect features in the ILD layer and barrier polish stop layer. The integrated circuit is polished to remove the copper overburden and expose the barrier polish stop layer.

15 Claims, 3 Drawing Sheets

INTEGRATED CIRCUITS INCLUDING BARRIER POLISH STOP LAYERS AND METHODS FOR THE MANUFACTURE THEREOF

TECHNICAL FIELD

The present invention relates generally to semiconductor device fabrication processes and, more particularly, to methods for the manufacture of integrated circuits including barrier polish stop layers, as well as to integrated circuits produced in accordance with such methods.

BACKGROUND

During front end-of-the-line processing, a plurality of semiconductor devices (e.g., transistors, resistors, capacitors, and the like) are formed on a semiconductor wafer. During Back End-of-the-Line ("BEoL") processing, the semiconductor devices are interconnected to form a plurality of integrated circuits on the wafer, which are subsequently separated into individual die during wafer dicing. Interconnection of the semiconductor devices is accomplished via the formation of electrically-conductive features (e.g., interconnect lines and conductive contacts or plugs) in a plurality of dielectric layers successively deposited over the semiconductor devices during BEoL processing. For example, contact openings are etched in the first dielectric layer deposited directly over the semiconductor devices (commonly referred to as the "pre-metal dielectric layer"), a conductive material (e.g., tungsten) is deposited into the contact openings, and the excess conductive material is removed by chemical mechanical planarization to produce a plurality of conductive contacts or plugs embedded in the pre-metal dielectric layer and in ohmic contact with electrically-active elements of the semiconductor devices (e.g., doped regions, gate electrodes, etc.). Similarly, during fabrication of the BEoL metal levels, contact openings and trenches are etched within each inter-level dielectric ("ILD") layer and a sacrificial capping layer formed over each ILD layer, filled with copper (or other conductive material), and the excess copper is removed to yield a plurality of conductive interconnect features (contacts and interconnect lines) electrically interconnecting the semiconductor devices of the integrated circuits.

After metallization of each BEoL metal level, a chemical mechanical planarization ("CMP") polish process is commonly performed to remove the excess copper from over the newly-patterned ILD layer. The CMP polish process is often performed in multiple successive stages concluding with a barrier polish stage wherein the sacrificial capping layer is removed, along with an upper portion of the ILD layer and the interconnect features, to impart the ILD layer with a substantially planar upper surface. As conventionally performed, the barrier polish is carried-out for a fixed duration of time sufficient to ensure complete removal of the capping layer. However, while polish duration can be held consistent through repeated iterations of the barrier polish, the rate of material removal generally cannot due to unavoidable discrepancies in the chemical behavior of polish consumables and in the performance of the CMP tooling (e.g., variation in polish pad removal rates). Consequently, the thickness removed from the ILD layer and from the interconnect features, and thus the post-CMP thickness of the ILD layer and interconnect features, can vary significantly between iterations of the barrier polish process. Such variations in the post-CMP thickness of the ILD layer and interconnect features result in correspondingly large variations in metallization layer resistance, which is especially problematic in smaller devices (e.g., circuit designs for semiconductor generations equal to or less than 32 nanometers), and an undesirable reduction in overall wafer-to-wafer, lot-to-lot, and wafer-in-wafer uniformity.

It would thus be desirable to provide embodiments of an integrated circuit fabrication method wherein inter-level dielectric and interconnect feature thicknesses are consistently maintained within relatively narrow ranges through successive iterations of the post-metallization polishing process to improve wafer-to-wafer, lot-to-lot, and wafer-in-wafer uniformity. It would also be desirable to provide embodiments of an integrated circuit produced in accordance with such a fabrication method. Other desirable features and characteristics of the present invention will become apparent from the subsequent detailed description and the appended Claims, taken in conjunction with the accompanying Drawings and the foregoing Technical Field and Background.

BRIEF SUMMARY

Embodiments of a method for fabricating an integrated circuit are provided. In one embodiment, the method includes the steps of depositing an interlayer dielectric ("ILD") layer over a semiconductor device, depositing a barrier polish stop layer over the ILD layer, and patterning at least the barrier polish stop layer and the ILD layer to create a plurality of etch features therein. Metal is plated over the barrier polish stop layer and into the plurality of etch features to produce a metal overburden overlying the barrier polish stop layer and to produce a plurality of conductive interconnect features in the ILD layer and barrier polish stop layer. The integrated circuit is polished to remove the metal overburden and expose the barrier polish stop layer.

Embodiments of an integrated circuit are further provided. In one embodiment, the integrated circuit includes a semiconductor wafer, a plurality of semiconductor devices formed on the semiconductor wafer, a pre-metal dielectric layer formed over the plurality of semiconductor devices, and a plurality of metal levels formed over the pre-metal dielectric layer. At least one of the plurality of metal levels includes an inter-level dielectric ("ILD") layer, a barrier polish stop layer formed over the ILD layer, an etch stop layer formed over the barrier polish stop layer, and a plurality of conductive interconnect features formed through the ILD layer and the barrier polish stop layer.

BRIEF DESCRIPTION OF THE DRAWINGS

The present invention will hereinafter be described in conjunction with the following drawing figures, wherein like numerals denote like elements, and wherein.

DETAILED DESCRIPTION

The following Detailed Description is merely exemplary in nature and is not intended to limit the invention or the application and uses of the invention. Furthermore, there is no intention to be bound by any expressed or implied theory presented in the preceding Technical Field, Background, Brief Summary, or the following Detailed Description.

Certain terminology may appear in the following Detailed Description that describes the direction or orientation of structural elements. Such terminology is utilized herein for the purpose of reference only and is not intended to be limiting. For example, terms such as "upper," "lower," "above," and "below" refer to directions and relative orientations in the subsequently-referenced Drawings. These and similar terms may be utilized herein to describe the orientation and/or location of a feature or element within a consistent, but arbitrary frame of reference, which is made clear by reference to the text and the associated Drawings describing the component, device, and/or process under discussion. In this regard, the term "over," the term "overlying," and similar terms are utilized to indicate relative position between two structural elements or layers and not necessarily to denote physical contact between structural elements or layers.

The following describes exemplary embodiments of a semiconductor fabrication process and, specifically, exemplary embodiments of a method for the formation of integrated circuits including metal levels during Back End-of-the-Line ("BEoL") processing wherein the thickness of the inter-level dielectric, as well as the thickness of the metal interconnects formed within the inter-level dielectric, is maintained within more restrictive tolerances than those attainable utilizing currently-known fabrication methods. Pursuant to embodiments of the integrated circuit fabrication process, a barrier polish stop layer is formed over at least one inter-level dielectric ("ILD") layer prior to lithographical patterning, etching, and metallization. The barrier polish stop layer preserves the ILD thickness, and therefore interconnect thickness, through the subsequent polish process. In so doing, the barrier polish stop layer enables metallization layer resistance to be more reliably maintained with a relatively narrow range across repeated iterations of the metal level fabrication process to improve overall wafer-to-wafer, lot-to-lot, and wafer-in-wafer uniformity.

Figure 1:
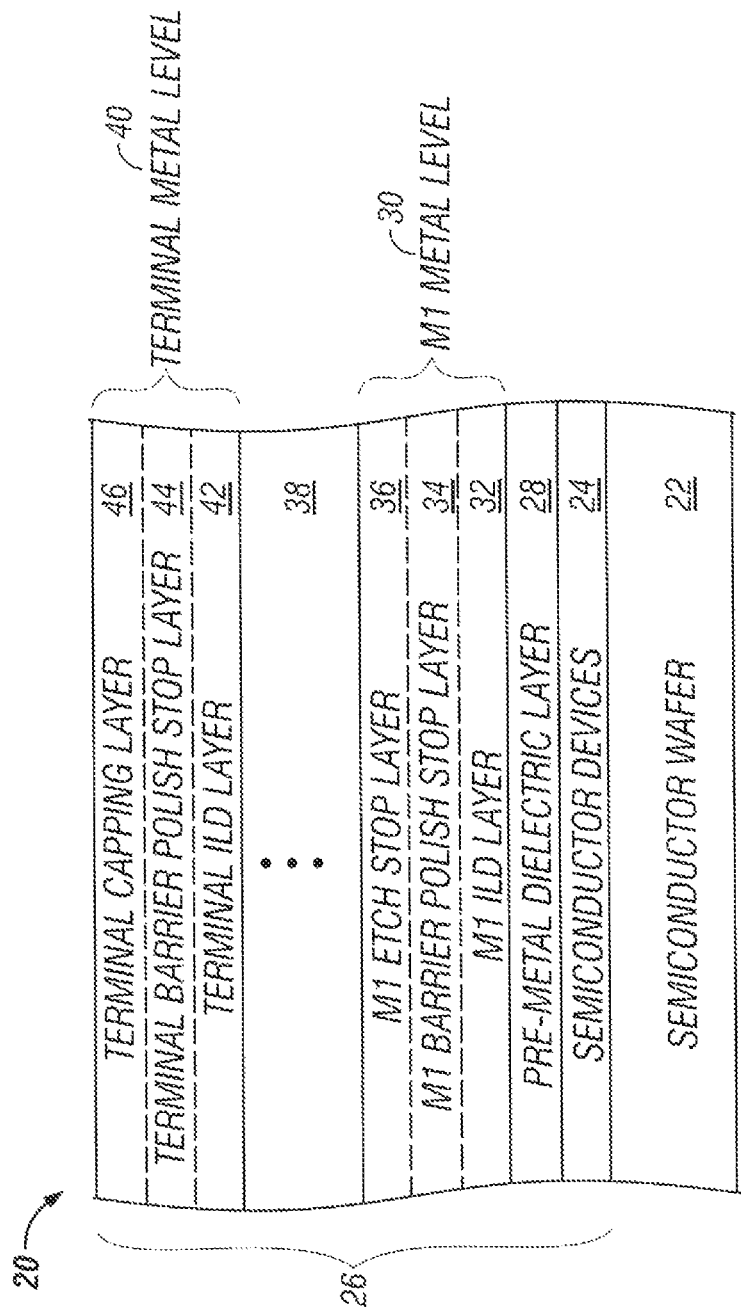
FIG. 1 is a generalized cross-sectional view of an integrated circuit including a plurality of barrier polish stop layers and produced in accordance with an exemplary embodiment of the semiconductor fabrication process described herein.

FIG. 1 is a generalized cross-sectional view of an exemplary integrated circuit 20 including a semiconductor wafer 22 having a plurality of semiconductor devices 24 formed thereon (wafer 22 is partially shown in FIG. 1 and not drawn to scale). Wafer 22 may assume the form of any substrate on or in which semiconductor devices 24 can be fabricated including, but not limited to, type IV semiconductor materials, as well as type III-V and II-VI semiconductor materials, organic semiconductors, and combinations thereof, whether in bulk single crystal, polycrystalline form, thin film form, semiconductor-on-insulator form, or combinations thereof. Semiconductor devices 24 are interconnected by a number of layers 26 formed during BEOL processing, including a pre-metal dielectric (PMD) layer 28 initially formed over semiconductor devices 24. A first ("$M_1$") metal level 30 is formed over PMD layer 28 and includes several BEOL layers. $M_1$ metal level 30 is conveniently formed utilizing a damascene or dual damascene process wherein a first layer of inter-level dielectric (ILD) material (identified in FIG. 1 as "$M_1$ ILD layer 32") is deposited over PMD layer 28 and etched to create a pattern therein. A conductive material, such as copper, is then deposited into the pattern. The excess copper is removed utilizing a chemical mechanical planarization (CMP) process to yield a number of metal interconnect lines within $M_1$ ILD layer 32 (not shown in FIG. 1 for clarity). A barrier polish stop layer 34 is further deposited over $M_1$ ILD layer 32 prior to lithographical patterning, etching, and plating to preserve the post-CMP thickness of $M_1$ ILD layer 32 and the interconnect features formed within layer 32, as described in detail below.

After completion the CMP polish process and the removal of the copper overburden, an $M_1$ etch stop layer 36 is formed over stop layer 34 to complete the fabrication of $M_1$ metal level 30. As indicated in FIG. 1 at 38, additional metal levels are then sequentially formed utilizing a similar process flow and concluding with the formation of the final or terminal metal level 40. As does $M_1$ metal level 30, terminal metal level 40 includes an ILD layer 42 patterned to include metal interconnect lines (not shown) and a barrier polish stop layer 44 deposited on ILD layer 42. In addition, terminal metal level 40 includes a capping layer 46 deposited over barrier polish stop layer 44. Although not shown in FIG. 1. for clarity, BEOL layers 26 will typically include additional layers that are conventionally known in the semiconductor industry and not described herein in the interest of concision. Such layers may include, but are not limited to, a passivation layer formed over terminal metal level 40 and various additional layers (e.g., barrier films, contact layers, adhesion films, etc.) included within each metal level.

FIGS. 2-9 are simplified cross-sectional views of a portion of integrated circuit 20 illustrated during various stages of manufacture and produced in accordance with an exemplary embodiment of the present invention. Integrated circuit 20 is shown during Back End-of-the-Line processing and, specifically, during the formation of a second ("$M_2$") metal level 50 over previously-formed $M_1$ metal level 30. As described above in conjunction with FIG. 1, $M_1$ metal level 30 includes an ILD layer 32, a barrier polish stop layer 34 (not shown in FIGS. 2-9), and an etch stop layer 36. The illustrated portion of $M_1$ metal level 30 shown in FIGS. 2-9 also includes a plurality of conductive contacts 52 (e.g., copper plugs), which are formed through the layers of $M_1$ metal level 30 to provide electrical communication with contacts (e.g., tungsten plugs) provided in PMD dielectric layer 28 (FIG. 1) and in ohmic contact with, for example, source/drain regions of semiconductor substrate 22 or electrically-active elements (e.g., gate electrodes) included within semiconductor devices 24 (FIG. 1).

Figure 2:
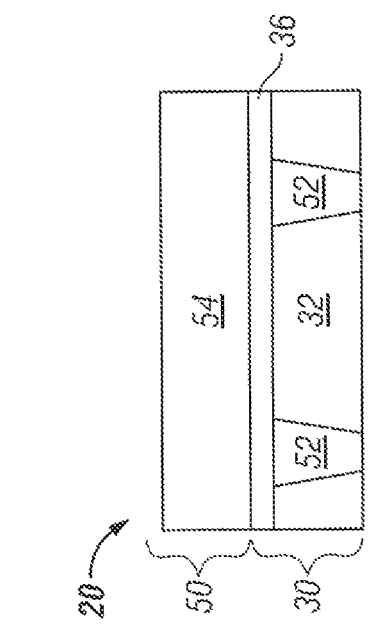

Referring initially to FIG. 2, the fabrication of $M_2$ metal level 50 commences with the deposition of an ILD layer 54 over the exposed upper surface of $M_1$ etch stop layer 36. ILD layer 54 can be blanket deposited utilizing a chemical vapor deposition technique, such as low pressure chemical vapor deposition (LPCVD) or plasma enhanced chemical vapor deposition (PECVD) technique, performed with a silicon source material, such as tetraethylorthosilicate (TEOS). Alternatively, the insulative material utilized to form ILD layer 54 can be applied over $M_1$ etch stop layer 36 utilizing a spin-on technique. As a more specific example, ILD layer 54 can be formed by the plasma-enhanced chemical vapor deposition of silicon oxycarbide (SiCOH) over $M_1$ etch stop layer 36. ILD layer 54 is preferably deposited to a thickness between about 150 and about 300 nanometers ("nm").

Figure 3:
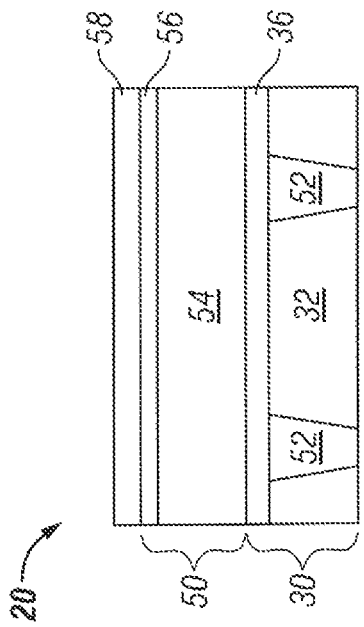
FIGS. 2-9 are simplified cross-sectional views of first and second metal levels included within the integrated circuit shown in FIG. 1 at various stages of manufacture and illustrated in accordance with an exemplary embodiment of the semiconductor fabrication process described herein.

Next, a barrier polish stop layer 56 and a sacrificial capping layer 58 are sequentially deposited over ILD layer 54 to yield the structure shown in FIG. 3. More specifically, barrier polish stop layer 56 is deposited onto the exposed upper surface of ILD layer 54; and sacrificial capping layer 58 is, in turn, deposited onto the exposed upper surface of stop layer 56. Barrier polish stop layer 56 can be formed from various different dielectric materials, which are resistant to removal during polishing and, specifically, during the barrier polish process described below in conjunction with FIG. 8. Barrier polish stop layer 56 is conveniently fabricated by chemical vapor deposition or physical vapor deposition of a polish-resistant material having a rate of removal less than the rate of removal of sacrificial capping layer 58 when subjected to the below-described barrier polish stage. In preferred embodiments, barrier polish stop layer 56 is formed via the deposition of an ultralow-k ("ULK") material or an oxide-based material having a relatively high carbon content; e.g., a carbon content exceeding about 150 parts per million and, more preferably, a carbon content between about 150 and about 300 parts per million. As appearing herein, the phrase "ultralow-k material" is defined as an insulative material having a dielectric constant less than about 2.6. In one embodiment, barrier polish stop layer 56 is formed via the deposition of a ULK material utilizing a selected precursor material, such as diethoxymethylsilane ("DEMS"), and a selected porogen, such as bicycloheptadiene ("BCHD Hydrocarbone"). Barrier polish stop layer 56 may be deposited to a thickness of, for example, about 10 to about 30 nm. Sacrificial capping layer 58, by comparison, can be, for example, an electrically insulative material deposited to a layer thickness of about 10 to about 50 nm. In one embodiment, sacrificial capping layer 58 is a silicon dioxide deposited utilizing a chemical vapor deposition (CVD) technique, such as low temperature Plasma-Enhanced CVD or Low Pressure CVD performed with silane ($SiH_4$) or tetraethylorthosilicate ($Si(OC_2H_5)_4$ or "TEOS") chemistries.

Figure 4:
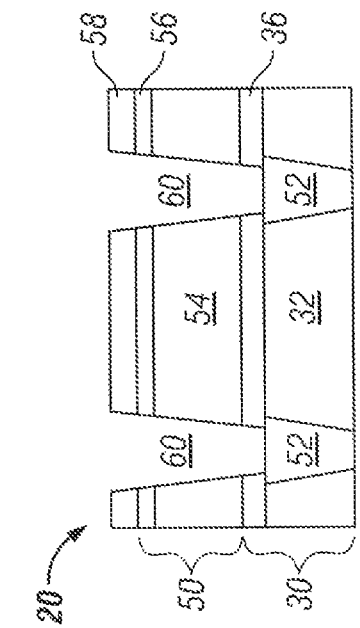

Continuing with the exemplary semiconductor fabrication process, lithographical patterning and etching is performed to create etch features (e.g., contact openings and trenches) within ILD layer 54. As shown in FIG. 4, the etch features may include a plurality of contact openings that extend through sacrificial capping layer 58, through barrier polish stop layer 56, through ILD layer 54, and through $M_1$ etch stop layer 36 to expose electrically-conductive elements (e.g., conductive plugs 52) previously-formed in ILD layer 32 of $M_1$ metal level 30. During one suitable lithographical patterning and etching process, a multi-layer lithographical stack (not shown) is formed over the upper surface of sacrificial capping layer 58. The multi-layer lithographical stack can be, for example, a tri-layer lithographical stack including an organic or optical planarizing layer (OPL), an antireflective coating (ARC) layer, and a photoresist layer. After deposition, the photoresist layer is patterned by exposure to an image pattern and treated with a developing solution. One or more etching steps are then performed to transfer the pattern formed in the photoresist layer to the ARC layer and the OPL. An anisotropic dry etch, such as a reactive ion etch, is then performed utilizing a first etch chemistry to remove areas of sacrificial capping layer 58, barrier polish stop layer 56, and ILD layer 54 exposed through the openings in the OPL and thereby create contact openings 60. During this initial etch, $M_1$ etch stop layer 36 prevents etch penetration to conductive contacts 52. A second etch may then be performed utilizing a second etch chemistry to remove the portions of $M_1$ etch stop layer 36 overlying conductive contacts 52 and thereby expose contacts 52 through contact openings 60. As indicated in the illustrated example, the etching process may be controlled to impart each contact opening 60 with a tapered geometry. Any remaining portion of the lithographical stack (e.g., the OPL) may then be stripped by ashing to yield the structure shown in FIG. 4.

Figure 5:
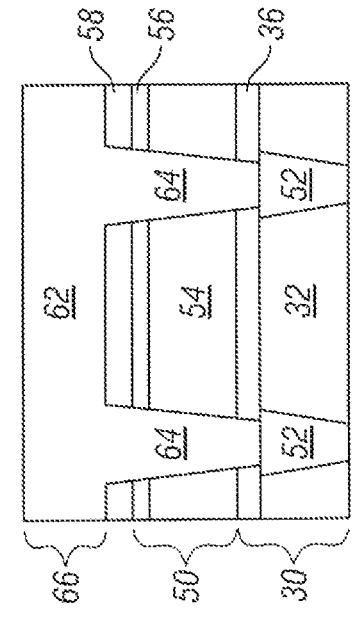

Advancing to FIG. 5, metal is next deposited onto sacrificial capping layer 58 and into the etch features formed in sacrificial capping layer 58, barrier polish stop layer 56, ILD layer 54, and $M_1$ etch stop layer 36. In the illustrated exemplary embodiment, specifically, a metal layer 62 is deposited onto sacrificial capping layer 58 to fill contact openings 60 (identified in FIG. 4) and thereby form conductive contacts or plugs 64. In a preferred embodiment, copper is plated over the partially-completed integrated circuit to form metal layer 62 and copper plugs 64 extending through sacrificial capping layer 58, barrier polish stop layer 56, ILD layer 54, and $M_1$ etch stop layer 36 to the contacts 52 (e.g., tungsten plugs) formed in ILD layer 32. Metallization also results in the formation of relatively thick metal overburden 66 overlying sacrificial capping layer 58. Although not shown in FIG. 5 for clarity, a capping layer (e.g., tantalum nitride) and/or a seed layer (e.g., copper) may be deposited over partially-fabricated integrated circuit 20 prior to deposition of metal layer 62 utilizing, for example, a conventionally-known physical or chemical vapor deposition technique.

Figure 6:
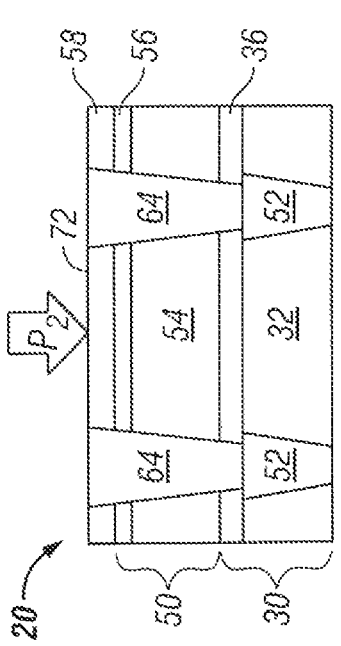
Figure 7:
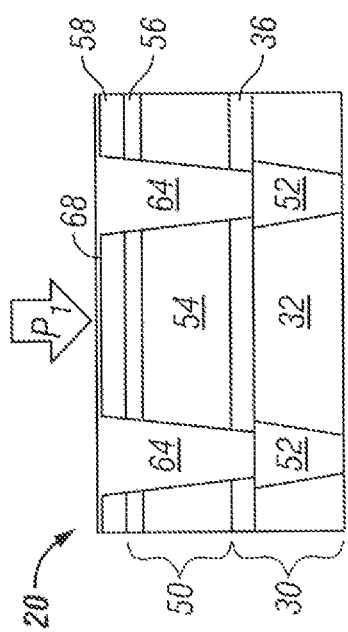
Figure 8:
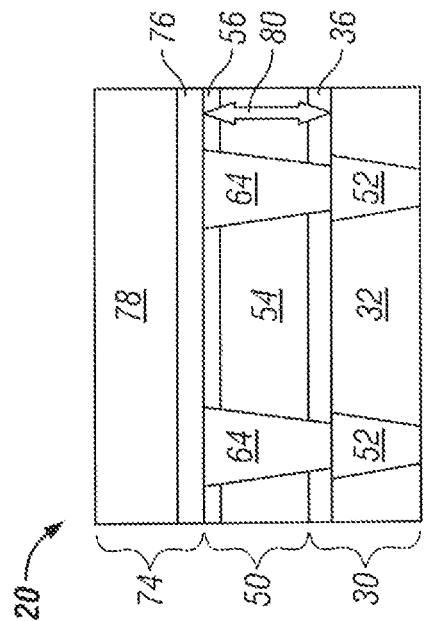

A polish process is utilized to remove metal (e.g., copper) overburden 66 from over sacrificial capping layer 58, as well as layer 58 and a portion of barrier polish stop layer 56. As indicated in FIGS. 6-8, one exemplary multi-stage polish process may be performed as follows. During the first stage of the polish process (represented in FIG. 6 by arrow $P_1$), relatively aggressive polishing is performed on a first chemical mechanical planarization ("CMP") platen to remove the bulk of metal overburden 66 (identified in FIG. 5). At the conclusion of this initial bulk removal stage, a relatively thin layer of metal may still overlie sacrificial capping layer 58, as shown in FIG. 5 at 66. Next, during a second stage of the polish process (represented in FIG. 7 by arrow $P_2$), less aggressive polishing is performed on a second CMP platen to clear away any remaining copper overburden. As indicated in FIG. 7 at 72, this results in the exposure of sacrificial capping layer 58 and, perhaps, removal of a relatively small volume of material from layer 58 and contacts 64. Sacrificial capping layer 58 thus serves as a stop layer during the copper clearing stage of the polish process.

During a third and final stage of the polish process (represented in FIG. 8 by arrow $P_3$), referred to herein as the "barrier polish stage" or, more simply, the "barrier polish," additional polishing is performed on a third CMP platen to remove sacrificial capping layer 58 in its entirety. A portion of barrier polish stop layer 56 is also removed during the barrier polish stage, which may impart stop layer 56 with a substantially planar upper surface 74. In a preferred embodiment, less about 10 nm is removed from barrier polish stop layer 56 during the barrier polish stage. As barrier polish stop layer 56 is formed from a polish-resistant material, such as a ULK or oxide-based material having a relatively high carbon content, polishing can be continued for a relatively long duration of time after removal of sacrificial capping layer 58 without significant material loss from layer 56; that is, a relatively lengthy over-polish can be performed. During the barrier polish stage, barrier polish stop layer 56 protects underlying ILD layer 54 to ensure that material is not removed from layer 54 and ILD thickness is preserved. As the barrier polish effectively stops on barrier polish stop layer 54, ILD thickness and uniformity are independent from barrier polish behavior. While some material will be removed from barrier polish stop layer 56 during the barrier polish (e.g., 10 nm or less), the amount of material removed will be relatively minimal as compared to the amount of material typically removed from ILD layer 54 in the absence of barrier polish stop layer 56; e.g., as much as 30-40 nm of thickness may be removed from ILD layer 54 during a fixed-duration barrier polish in the absence of barrier polish stop layer 56.

Figure 9:
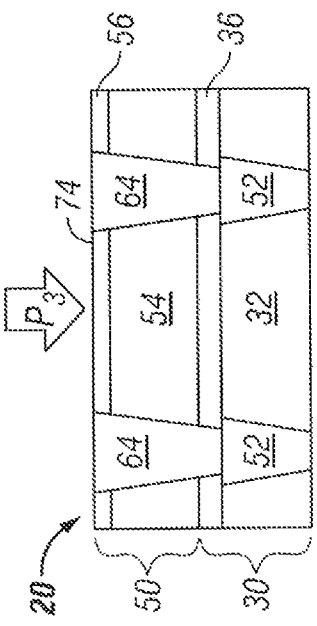

After performance of the above-described polish process, and with reference to FIG. 9, an etch stop layer 76 is formed over barrier polish stop layer 56 to complete the fabrication of $M_2$ metal level 50. Etch stop layer 76 is conveniently formed by the deposition of a low-k or ultralow-k material, such as by the plasma-enhanced chemical vapor deposition of silicon carbon nitride (SiCN). Etch stop layer 76 can be deposited to a thickness of, for example, 10 to 50 nm. After deposition of etch stop layer 76, fabrication of the next metal level (e.g., a third metal level 74) may commence with the deposition of an inter-level dielectric layer 78. The steps described above can be repeated to complete the fabrication of $M_3$ metal level 74 and any additional metal levels included within integrated circuit 20. Conventional steps are then performed, as necessary, to complete the fabrication of integrated circuit 20.

The foregoing has thus provided embodiments of an integrated circuit fabrication method wherein inter-level dielectric and interconnect feature thickness are better maintained through the post-metallization polishing process. With respect to the illustrated example, specifically, it should be appreciated that the cumulative thickness of $M_2$ metal level 50 (represented in FIG. 9 by double-headed arrow 80) will vary between iterations of the metal level fabrication process by an amount substantially equivalent to variation in material removed from barrier polish stop layer 56 during the above-described chemical mechanical planarization process and, specifically, during the above-described barrier polish. As a relatively small amount of material will typically removed from barrier polish stop layer 56 (e.g., less than 10 nm) during each iteration of the barrier polish stage, the variation in cumulative thickness of $M_2$ metal level 50 across repeated iterations of metal level fabrication will be relatively minimal; e.g., the variation in cumulative metal level thickness can typically be held to less than 10 nm, which represents a three to four fold improvement over conventionally-performed metal level fabrication processes wherein the variation in inter-level dielectric thickness, and therefore cumulative metal level thickness, often approaches or exceeds 30 to 40 nm. As a result, variations in metallization layer resistance are minimized and overall wafer-to-wafer, lot-to-lot, and wafer-in-wafer uniformity is significantly improved. The foregoing has also provided embodiments of an integrated circuit produced in accordance with such a fabrication method.

in one embodiment of the above-described integrated circuit manufacturing method a partially-fabricated integrated circuit is provided that includes a semiconductor device, an interlayer dielectric ("ILD") layer overlaying the semiconductor device, a capping layer overlaying the ILD layer, and a barrier polish stop layer disposed between the ILD layer and the capping layer. A plurality of contact openings is then formed through the capping layer, the barrier polish stop layer, and the ILD layer. Copper is plated over the capping layer and into the plurality of contact openings to produce a copper overburden overlying the capping layer and to produce a plurality of copper contacts extending through the capping layer, the barrier polish stop layer, and the ILD layer. Finally, the partially-fabricated integrated circuit is subjected to a chemical mechanical planarization ("CMP") process to remove the copper overburden, the capping layer, and a portion of the barrier polish stop layer, while leaving intact the majority of the barrier polish stop layer and the entirety of the ILD layer.

While at least one exemplary embodiment has been presented in the foregoing Detailed Description, it should be appreciated that a vast number of variations exist. It should also be appreciated that the exemplary embodiment or exemplary embodiments are only examples, and are not intended to limit the scope, applicability, or configuration of the invention in any way. Rather, the foregoing Detailed Description will provide those skilled in the art with a convenient road map for implementing the exemplary embodiment or exemplary embodiments. It should be understood that various changes can be made in the function and arrangement of elements without departing from the scope of the invention as set forth in the appended Claims and the legal equivalents thereof.

What is claimed is:

1. A method for manufacturing an integrated circuit, comprising:
    depositing an interlayer dielectric ("ILD") layer over a semiconductor device;
    depositing a barrier polish stop layer over the ILD layer;
    depositing a capping layer over the barrier polish stop layer;
    patterning at least the capping layer, the barrier polish stop layer, and the ILD layer to create a plurality of etch features therein;
    plating metal over the capping layer, the barrier polish stop layer, and into the plurality of etch features to produce a metal overburden overlying the capping layer and the barrier polish stop layer and to produce a plurality of conductive interconnect features in the ILD layer, the barrier polish stop layer, and the capping layer; and
    chemical mechanical planarizing the integrated circuit to remove the metal overburden and the capping layer and expose the barrier polish stop layer, wherein chemical mechanical planarizing comprises:
        removing the bulk of the metal overburden utilizing a first polish platen;
        clearing any remaining metal overburden from over the capping layer utilizing a second polish platen; and
        removing the capping layer and a portion of the conductive interconnect features utilizing a third polish platen to expose the barrier polish stop layer.

2. A method according to claim 1 wherein depositing a barrier polish stop layer comprises forming a barrier polish stop layer over the ILD layer by depositing a material having a rate of removal less than the rate of removal of the capping layer during polishing.

3. A method according to claim 1 wherein chemical mechanical planarizing comprises chemical mechanical planarizing the integrated circuit to remove the metal overburden, the capping layer, and less than about 10 nanometers of thickness from the barrier polish stop layer.

4. A method according to claim 1 wherein depositing a barrier polish stop layer over the ILD layer comprises depositing a barrier polish stop layer to a thickness between about 10 nanometers and about 30 nanometers.

5. A method according to claim 1 wherein depositing a barrier polish stop layer comprises forming a barrier polish stop layer over the ILD layer by depositing a material selected from the group consisting of an ultralow-k material and an oxide-based material.

6. A method according to claim 1 wherein depositing a barrier polish stop layer comprises forming a barrier polish stop layer over the ILD layer by depositing a material having a carbon content greater than about 150 parts per million.

7. A method according to claim 6 wherein depositing the barrier polish stop layer comprises forming a barrier polish stop layer over the ILD layer by depositing a material having a carbon content less than about 300 parts per million.

8. A method according to claim 5 wherein depositing a barrier polish stop layer comprises forming a barrier polish stop layer over the ILD layer utilizing a pre-cursor material comprising diethoxymethylsilane.

9. A method according to claim 8 wherein forming a barrier polish stop layer over the ILD layer comprises forming a barrier polish stop layer over the ILD layer utilizing a precursor material comprising diethoxymethylsilane deposited with a selected porogen.

10. A method according to claim 1 further comprising forming an etch stop layer over the barrier polish stop layer after polishing the integrated circuit to remove the metal overburden and expose the barrier polish stop layer.

11. A method for manufacturing an integrated circuit, comprising:
providing a partially-fabricated integrated circuit comprising a semiconductor device, an interlayer dielectric ("ILD") layer overlaying the semiconductor device, a capping layer overlaying the ILD layer, and a barrier polish stop layer disposed between the ILD layer and the capping layer;
forming a plurality of contact openings through the capping layer, the barrier polish stop layer, and the ILD layer;
plating copper over the capping layer and into the plurality of contact openings to produce a copper overburden overlying the capping layer and to produce a plurality of copper contacts extending through the capping layer, the barrier polish stop layer, and the ILD layer; and
subjecting the partially-fabricated integrated circuit to a chemical mechanical planarization ("CMP") process comprising:
removing the bulk of the copper overburden utilizing a first polish platen;
clearing any remaining copper overburden from over the capping layer utilizing a second polish platen; and
removing the capping layer, a portion of the copper contacts, and a portion of barrier polish stop layer utilizing a third polish platen while leaving intact the majority of the barrier polish stop layer and the entirety of the ILD layer.

12. A method according to claim 11 wherein removing the capping layer, a portion of the copper contacts, and a portion of barrier polish stop layer comprises removing the capping layer, a portion of the copper contacts, and less than 10 nanometers of thickness from barrier polish stop layer utilizing a third polish platen.

13. A method according to claim 11 further comprising forming an etch stop layer over the barrier polish stop layer after subjecting the partially-fabricated integrated circuit to the CMP process.

14. A method according to claim 11 wherein depositing a polish-resistant material having a carbon content exceeding about 150 parts per million comprises depositing a polish-resistant material having a carbon content exceeding about 150 parts per million to form a barrier polish stop layer over the ILD layer, the barrier polish stop layer having a thickness between about 10 nanometer and 30 nanometers.

15. A method according to claim 14 wherein depositing a polish-resistant material having a carbon content exceeding about 150 parts per million comprises depositing a polish-resistant material having a carbon content exceeding about 150 parts per million to form a barrier polish stop layer over the ILD layer, the barrier polish stop layer selected from the group consisting of an ultralow-k material and an oxide-based material.

* * * * *